(12) United States Patent
Huai et al.

(10) Patent No.: US 6,838,740 B2
(45) Date of Patent: Jan. 4, 2005

(54) THERMALLY STABLE MAGNETIC ELEMENTS UTILIZING SPIN TRANSFER AND AN MRAM DEVICE USING THE MAGNETIC ELEMENT

(75) Inventors: Yiming Huai, Pleasanton, CA (US); Paul P. Nguyen, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 271 days.

(21) Appl. No.: 10/259,129

(22) Filed: Sep. 27, 2002

(65) Prior Publication Data

US 2004/0061154 A1 Apr. 1, 2004

(51) Int. Cl.$^7$ .............................................. H01L 43/00
(52) U.S. Cl. ....................... 257/421; 257/295; 257/296; 257/422
(58) Field of Search ................................ 257/295, 296, 257/421, 422; 365/171; 350/314, 322, 324.11

(56) References Cited

U.S. PATENT DOCUMENTS

| | | | | |
|---|---|---|---|---|
| 5,880,913 | A | * 3/1999 | Gill | 360/324.11 |
| 6,069,820 | A | * 5/2000 | Inomata et al. | 365/171 |
| 6,418,048 | B1 | * 7/2002 | Sin et al. | 365/173 |
| 6,447,935 | B1 | * 9/2002 | Zhang et al. | 428/692 |
| 6,473,275 | B1 | * 10/2002 | Gill | 360/314 |
| 6,519,122 | B1 | * 2/2003 | Kakihara | 360/324.12 |
| 6,532,164 | B2 | 3/2003 | Redon et al. | 365/97 |
| 6,538,859 | B1 | * 3/2003 | Gill | 360/324.12 |
| 6,600,638 | B2 | * 7/2003 | Gill | 360/324.11 |
| 6,662,432 | B2 | * 12/2003 | Balamane et al. | 29/603.07 |
| 6,671,139 | B2 | * 12/2003 | Carey et al. | 360/324.12 |
| 6,700,755 | B2 | * 3/2004 | Pinarbasi | 360/324.11 |
| 6,714,444 | B2 | * 3/2004 | Huai et al. | 365/171 |
| 6,751,845 | B2 | * 6/2004 | Gill | 29/603.14 |
| 2002/0105827 | A1 | 8/2002 | Redon et al. | 365/173 |
| 2003/0007398 | A1 | 1/2003 | Daughton et al. | 365/200 |
| 2003/0059588 | A1 | 3/2003 | Hannah et al. | 428/200 |

OTHER PUBLICATIONS

Anderson, Geoffrey W., "Spin–Valve Thermal Stability: Interdiffusion versus Exchange Biasing," IEEE, Sep. 2000, vol. 36, No. 5, pp. 2605–2607.

Sun, J.Z., "Spin–Current Interaction with a Monodomain Magnetic Body: a Model Study," The American Physical Society, Physical Review B, Jul. 1, 2000, vol. 62, No. 1, pp. 570–578.

(List continued on next page.)

Primary Examiner—Richard Elms
Assistant Examiner—Doug Menz
(74) Attorney, Agent, or Firm—Sawyer Law Group LLP

(57) ABSTRACT

A method and system for providing a magnetic element capable of being written using spin-transfer effect while being thermally stable and a magnetic memory using the magnetic element are disclosed. The magnetic element includes a first, second and third pinned layers, first and second nonmagnetic layers, a free layer and a nonmagnetic spacer layers. The first, second and third pinned layers are ferromagnetic and have first, second and third magnetizations pinned in first, second and third directions. The first and second nonmagnetic layers include first and second diffusion barriers, respectively. The first and second nonmagnetic layers are between the first and second pinned layers and the second and third pinned layers, respectively. The first and second pinned layers and the second and third pinned layers are antiferromagnetically coupled. The nonmagnetic spacer layer is conductive and resides between the free layer and the third pinned layer. In addition, performance can be further improved by doping Co containing ferromagnetic layers with Cr and/or Pt.

43 Claims, 9 Drawing Sheets

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809–3811.

J.A. Katine, et al, "Current–Driven Magnetization Reversal and Spin–Wave Excitations in Co/Cu/Co Pillars", the American Physical Society, vol. 84, No. 14, Apr. 3, 2000, pp. 3149–3151.

E.G. Myers, et al, "Point–Contact Studies of Current–Controlled Domain Switching in Magnetic Multilayers" Journal of Applied Physics, vol. 87, No. 9, May 1, 2000, pp. 5502–5503.

J.C. Slonczewski, "Theory and Application of Exchange–Driven Switching", IEEE, Apr. 2000, pp. CE–02.

J.C. Slonczewski, "Current–Driven Excitation of Magnetic Multilayers", Journal of Magnetism and Magnetic Materials, 1996, pp. 1.1–1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995–7002.

J.Z. Sun, "Current–Driven Magnetic Switching in Manganite Trilayer Junctions", Journal of Magnetism and Mangetic Materials, No. 202, 1999, pp. 157–162.

Daughton, et al., Patent Publication US2003/0007398 dated Jan. 9, 2003 Figures 3, 4, 5A; Paragraphs 60, 61, 67, 68.

* cited by examiner

US 6,838,740 B2

THERMALLY STABLE MAGNETIC ELEMENTS UTILIZING SPIN TRANSFER AND AN MRAM DEVICE USING THE MAGNETIC ELEMENT

CROSS-REFERENCE TO RELATED APPLICATIONS

The present application is related U.S. patent application Ser. No. 10/213,537 entitled MAGNETIC ELEMENT UTILIZING SPIN TRANSFER AND AN MRAM DEVICE USING THE MAGNETIC ELEMENT," filed on Aug. 6, 2002, and assigned to the assignee of the present application.

FIELD OF THE INVENTION

The present invention relates to magnetic memory systems, and more particularly to a method and system for providing a more thermally stable element that employs a spin transfer effect in switching and that can be used in a magnetic memory such as magnetic random access memory ("MRAM").

BACKGROUND OF THE INVENTION

Magnetic memories are often used in storing data. One type of memory element currently of interest utilizes magnetoresistance of a magnetic element for storing data. FIGS. 1A and 1B depict conventional magnetic elements 1 and 1'. The conventional magnetic element 1 is a spin valve 1 and includes a conventional antiferromagnetic layer 2, a conventional pinned layer 4, a conventional spacer layer 6 and a conventional free layer 8. The conventional pinned layer 4 and the conventional free layer 8 are ferromagnetic. The conventional spacer layer 6 is nonmagnetic. The conventional spacer layer 6 is conductive. The antiferromagnetic layer 2 is used to fix, or pin, the magnetization of the pinned layer 4 in a particular direction. The magnetization of the free layer 8 is free to rotate, typically in response to an external field.

The conventional magnetic element 1' is a spin tunneling junction. Portions of the conventional spin tunneling junction 1' are analogous to the conventional spin valve 1. Thus, the conventional magnetic element 1' includes an antiferromagnetic layer 2', a conventional pinned layer 4', an insulating barrier layer 6' and a free layer 8'. The conventional barrier layer 6' is thin enough for electrons to tunnel through in a conventional spin tunneling junction 1'.

Depending upon the orientations of the magnetizations of the free layer 8 or 8' and the pinned layer 4 or 4', respectively, the resistance of the conventional magnetic element 1 or 1', respectively, changes. When the magnetizations of the free layer 8 and pinned layer 4 are parallel, the resistance of the conventional spin valve 1 is low. When the magnetizations of the free layer 8 and the pinned layer 4 are antiparallel, the resistance of the conventional spin valve 1 is high. Similarly, when the magnetizations of the free layer 8' and pinned layer 4' are parallel, the resistance of the conventional spin tunneling junction 1' is low. When the magnetizations of the free layer 8' and pinned layer 4' are antiparallel, the resistance of the conventional spin tunneling junction 1' is high.

In order to sense the resistance of the conventional magnetic element 1/1', current is driven through the conventional magnetic element 1/1'. Current can be driven through the conventional magnetic element 1 in one of two configurations, current in plane ("CIP") and current perpendicular to the plane ("CPP"). However, for the conventional spin tunneling junction 1', current is driven in the CPP configuration. In the CIP configuration, current is driven parallel to the layers of the conventional spin valve 1. Thus, in the CIP configuration, current is driven from left to right or right to left as seen in FIG. 1A. In the CPP configuration, current is driven perpendicular to the layers of conventional magnetic element 1/1'. Thus, in the CPP configuration, current is driven up or down as seen in FIG. 1A or 1B. The CPP configuration is used in MRAM having a conventional spin tunneling junction 1' in a memory cell.

FIG. 2 depicts a conventional memory array 10 using conventional memory cells 20. Each conventional memory cell 20 includes a conventional magnetic element 1/1', depicted as a resistor in FIG. 2. The conventional memory array 10 typically uses a spin tunneling junction 1'. The conventional array 10 is shown as including four conventional memory cells 20. Each memory cell 20 includes a conventional spin tunneling junction 1' and a transistor 22. The memory cells 20 are coupled to reading/writing column selection 30 via bit lines 32 and 34 and to row selection 50 via word lines 52 and 54. Also depicted are write lines 60 and 62 which carry currents that generate external magnetic fields for the corresponding conventional memory cells 20 during writing. The reading/writing column selection 30 is coupled to write current source 42 and read current source 40 which are coupled to a voltage supply Vdd 48 via line 46.

In order to write to the conventional memory array 10, the write current Iw 42 is applied to the bit line 32 or 34 selected by the reading/writing column selection 30. The read current Ir 40 is not applied. Both word lines 52 and 54 are disabled. The transistors 22 in all memory cells are disabled. In addition, one of the write lines 60 and 62 selected carries a current used to write to the selected conventional memory cell 20. The combination of the current in the write line 60 or 62 and the current in the bit line 32 or 34 generates a magnetic field large enough to switch the direction of magnetization of the free layer 8' and thus write to the desired conventional memory cell 20. Depending upon the data written to the conventional memory cell 20, the conventional magnetic tunneling junction 1' will have a high resistance or a low resistance.

When reading from a conventional cell 20 in the conventional memory array 10, the read current Ir 40 is applied instead. The memory cell 20 selected to be read is determined by the row selection 50 and column selection 30. The output voltage is read at the output line 44.

There is an additional requirement for the conventional magnetic elements 1 and 1'. The conventional magnetic elements 1 and 1' have sufficient thermal stability to be compatible with the CMOS processes in the integration of MRAM technology. In the case of building magnetic elements on the top of CMOS, the back end processes used in forming the magnetic memory 10 include sintering and oxide deposition using plasma enhanced chemical vapor deposition (PECVD). Typical temperatures for sintering and PECVD are approximately 450° C. and 350° C., respectively. In the case of embedded systems, several standard CMOS process steps occurs at or above 450° C. Consequently, the conventional magnetic elements 1 and 1' should be stable at these elevated temperatures. In addition, the conventional magnetic elements 1 and 1' also have operation temperatures above room temperature. In general, the signals from the conventional magnetic elements 1 and 1' degrade above 300° C. The degradation in the GMR and TMR signals are due to loss of pinning (a change in the magnetization of the pinned layer 4/4' from the pinned direction), interface polarization loss, and a resistance change due to the diffusion of elements, such as Mn, into the pinned layer 4/4' and the free layers 8/8'.

Although the conventional magnetic memory 10 using the conventional magnetic tunneling junction 1' can function, the conventional magnetic elements 1 and 1' undergo signal degradation at temperatures of approximately 300° C. It would also be desirable for the conventional magnetic elements 1 and 1' to be stable at higher temperatures, for example up to 450° C. or 500° C., in order to ensure that the magnetic elements 1 and 1' can function after back end processing or in the embedded systems. In addition, there are barriers to the use of the conventional magnetic element 1' and the conventional magnetic memory 10 at higher memory cell densities. In particular, the conventional memory array 10 is written using an external magnetic field generated by currents driven through the bit line 32 or 34 and the write line 60 or 62. In other words, the magnetization of the free layer 8' is switched by the external magnetic field generated by current driven through the bit line 32 or 34 and the write line 60 or 62. The magnetic field required to switch the magnetization of the free layer 8', known as the switching field, is inversely proportional to the width of the conventional magnetic element 1'. As a result, the switching field increases for conventional memories having smaller magnetic elements 1'. Because the switching field is higher, the current required to be driven through the bit line 32 or 34 and particularly through the write line 60 or 62 increases dramatically for higher magnetic memory cell density. This large current can cause a host of problems in the conventional magnetic memory 10. For example, cross talk and power consumption would increase. In addition, the driving circuits required to drive the current that generates the switching field at the desired memory cell 20 would also increase in area and complexity. Furthermore, the conventional write currents have to be large enough to switch a magnetic memory cell but not so large that the neighboring cells are inadvertently switched. This upper limit on the write current amplitude can lead to reliability issues because the cells that are harder to switch than others (due to fabrication and material nonuniformity) will fail to write consistently.

Accordingly, what is needed is a system and method for providing a magnetic memory element which has improved thermal stability and can be used in a memory array of high density, low power consumption, low cross talk, and high reliability, while providing sufficient read signal. The present invention addresses the need for such a magnetic memory element.

SUMMARY OF THE INVENTION

The present invention provides a method and system for providing a magnetic element capable of being written using spin-transfer effect while being thermally stable and a magnetic memory using the magnetic element. The magnetic element comprises a first, second and third pinned layers, first and second nonmagnetic layers, a free layer and a nonmagnetic spacer layers. The first, second and third pinned layers are ferromagnetic and have first, second and third magnetizations pinned in first, second and third directions. The first and second nonmagnetic layers include first and second diffusion barriers, respectively. The first and second nonmagnetic layers are between the first and second pinned layers and the second and third pinned layers, respectively. The first and second pinned layers and the second and third pinned layers are antiferromagnetically coupled. The nonmagnetic spacer layer is conductive and resides between the free layer and the third pinned layer. In addition, performance can be further improved by doping Co containing ferromagnetic layers with Cr and/or Pt.

According to the system and method disclosed herein, the present invention provides a magnetic element and a magnetic memory capable of being written using a more efficient and localized phenomenon while having improved thermal stability.

DETAILED DESCRIPTION OF THE INVENTION

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1A:
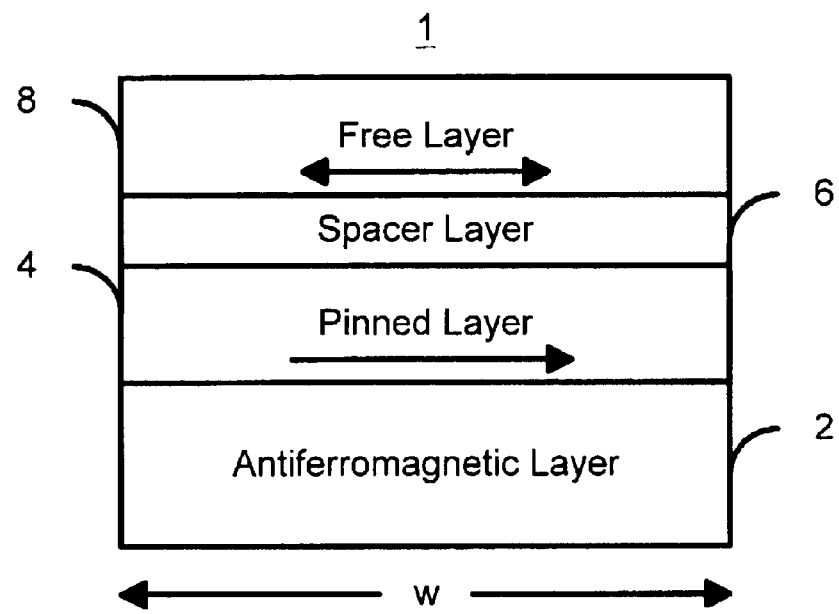
FIG. 1A is a diagram of a conventional magnetic element, a spin valve.
Figure 1B:
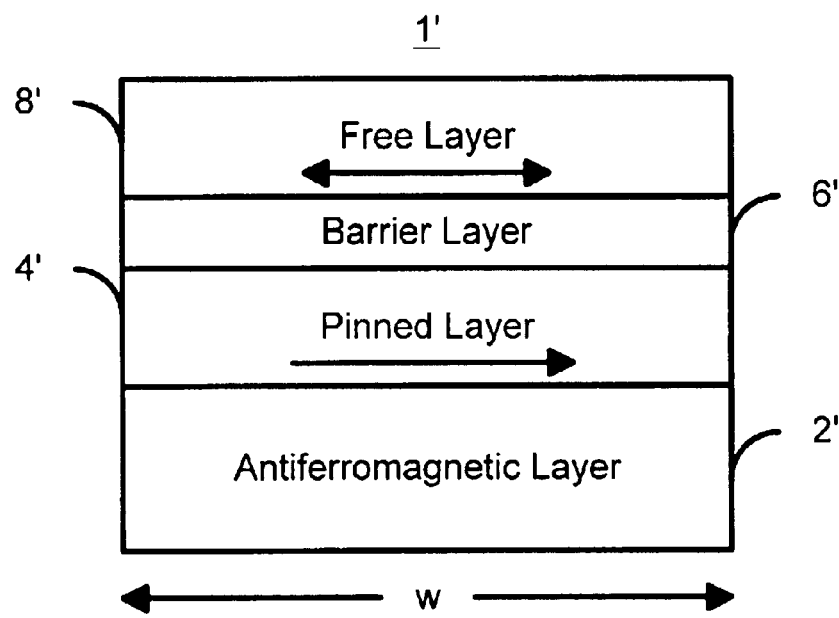
FIG. 1B is a diagram of a conventional magnetic element, a spin tunneling junction, such as an element used in a magnetic memory.
Figure 2:
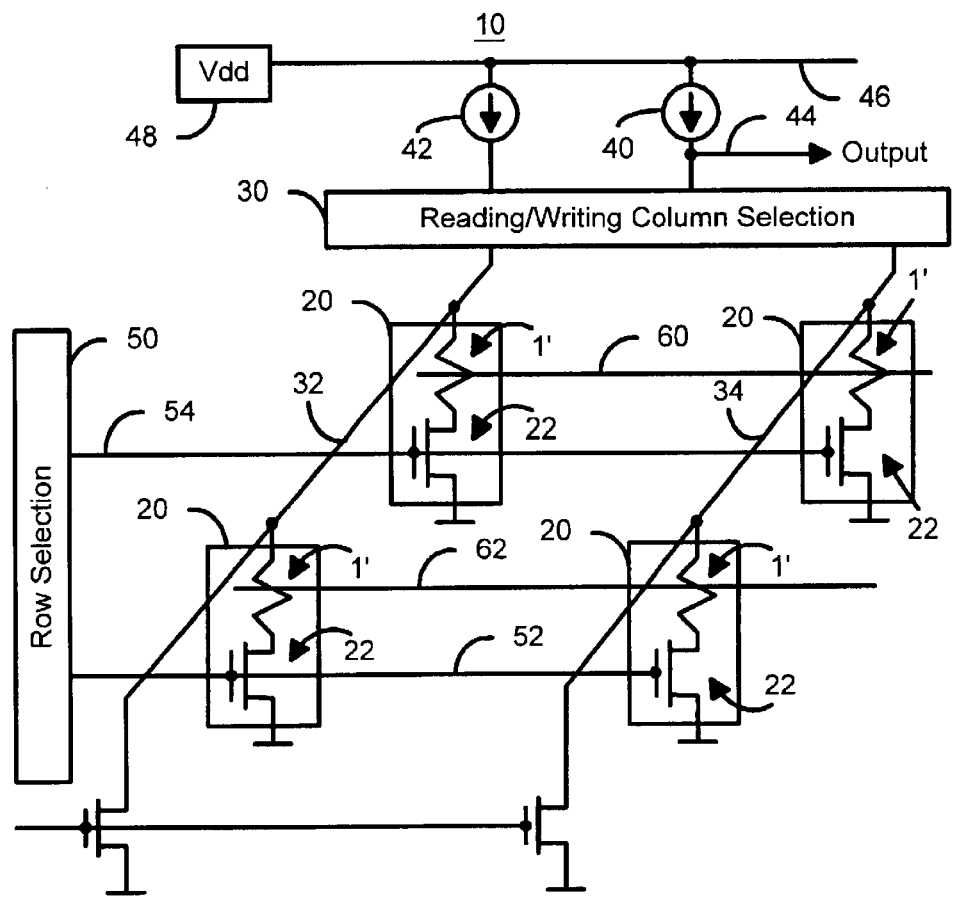
FIG. 2 is a diagram of a conventional magnetic memory array.

As described above, one of the challenges faced in increasing the density of conventional magnetic memories is the large current required to write to the conventional magnetic memories, such as the conventional magnetic memory 10 depicted in FIG. 2 and using the conventional magnetic elements 1' of FIG. 1B. In other words, the current required to generate the magnetic field that switches the direction of the magnetization of the free layer is large. This large current can be problematic because it can result in cross talk and high power consumption.

In order to overcome some of the issues associated with magnetic memories having a higher density of memory cells, a recently discovered phenomenon, spin transfer, may be utilized. Current knowledge of spin transfer is described in detail in J. C. Slonczewski, "Current-driven Excitation of Magnetic Multilayers," *Journal of Magnetism and Magnetic Materials*, vol. 159, p. L1–L5 (1996); L. Berger, "Emission of Spin Waves by a Magnetic Multilayer Traversed by a Current," Phys. *Rev. B*. Vol. 54, p. 9353 (1996), and in F. J. Albert, J. A. Katine and R. A. Buhman, "Spin-polarized Current Switching of a Co Thin Film Nanomagnet," *Appl. Phys. Lett.*, vol. 77, No. 23, p. 3809–3811 (2000). Thus, the following description of the spin transfer phenomenon is based upon current knowledge in the area and is not intended to limit the scope of the invention.

The spin-transfer effect arises from the spin-dependent electron transport properties of ferromagnetic-normal metal multilayers. When a spin-polarized current traverses a magnetic multiplayer in a CPP configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$–$10^8$ A/cm$^2$), and if the dimensions of the multilayer are small (approximately less than two hundred nanometers) so that self field effects are not important. In addition, for spin transfer to be able to switch the magnetization direction of a ferromagnetic layer, the ferromagnetic layer must be sufficiently thin, for instance, preferably less than approximately ten nanometers for Co.

The phenomenon of spin transfer can be used in the CPP configuration as an alternative to or in addition to using an external switching field to switch the direction of magnetization of the free layer 8 or 8' of the conventional spin valve 1 or the conventional spin tunneling junction 1', respectively. Spin transfer is a phenomenon which dominates other mechanisms and thus becomes observable when the dimensions of the conventional magnetic element 1/1' are small, in the range of few hundred nanometers. Consequently, spin transfer is suitable for higher density magnetic memories having smaller magnetic elements 1/1'.

For example, switching the magnetization of the conventional free layer 8 in the conventional spin valve 1 using spin transfer is described. Current can be driven from the conventional free layer 8 to the conventional pinned layer 4 to switch the magnetization of the conventional free layer 8 to be parallel to the magnetization of the conventional pinned layer 4. The magnetization of the conventional free layer 8 is assumed to be initially antiparallel to the conventional pinned layer 4. When current is driven from the conventional free layer 8 to the conventional pinned layer 4, conduction electrons travel from the conventional pinned layer 4 to the conventional free layer 8. The majority electrons traveling from the conventional pinned layer 4 have their spins polarized in the same direction as the magnetization of the conventional pinned layer 4. These electrons interact with the magnetic moments of the conventional free layer 8 near the interface between the conventional free layer 8 and the conventional spacer layer 6. As a result of this interaction, the electrons transfer their spin angular momentum to the conventional free layer 8. Thus, angular momentum corresponding to spins antiparallel to the magnetization of the conventional free layer 8 (and parallel to the conventional pinned layer 4) is transferred to the conventional free layer. If sufficient angular momentum is transferred by the electrons, the magnetization of the conventional free layer 8 can be switched to be parallel to the magnetization of the conventional free layer 4.

Alternatively, current can be driven from the conventional pinned layer 4 to the conventional free layer 8 to switch the magnetization of the conventional free layer 8 to be antiparallel to the magnetization of the conventional pinned layer 8. In this case the magnetization of the free layer 8 is assumed to be initially parallel to the pinned layer 4. When current is driven from the conventional pinned layer 4 to the conventional free layer 8, conduction electrons travel in the opposite direction. The majority electrons have their spins polarized in the direction of magnetization of the conventional free layer 8, which is originally magnetized in the same direction as the conventional pinned layer 4. These majority electrons are transmitted through the conventional pinned layer 4. However, the minority electrons, which have spins polarized antiparallel to the magnetization of the conventional free layer 8 and the conventional pinned layer 4, will be reflected from the conventional pinned layer 4 and travel back to the conventional free layer 8. The minority electrons reflected by the conventional pinned layer 4 interact with magnetic moments of the conventional free layer 8 and transfer at least a portion of their spin angular momentum to the conventional free layer 8. If sufficient angular momentum is transferred by the electrons to the conventional free layer 8, the magnetization of the free layer 8 can be switched to be antiparallel to the magnetization of the conventional pinned layer 4.

Using a current driven through the conventional magnetic elements 1 or 1' in the CPP configuration, spin transfer can switch the direction of magnetization of the free layer 8 or 8', respectively. Thus, spin transfer can be used to write to magnetic elements 1 or 1' in a magnetic memory by using a current through the conventional magnetic element 1 or 1'. The mechanism of spin-transfer writing is, therefore, more localized and generates less cross talk. Spin transfer is also more reliable because spin transfer results in a high effective field in the conventional magnetic elements 1/1' in a device such as MRAM. In addition, for a magnetic element 1 or 1' having a small enough size, the current required to switch the magnetization can be significantly less than the current required to generate a switching field in the conventional magnetic memory 10. Thus, there is less power consumption in writing.

Although the phenomenon of spin transfer can be used to switch the direction of the magnetization of the conventional free layer 8/8', one of ordinary skill in the art will readily recognize that there are additional barriers to using the conventional magnetic element 1/1' in a memory. For the conventional spin valve 1, the CPP configuration results in a significantly reduced signal. For example, the magnetoresistance ratio for the CPP configuration of the conventional spin valve 1 is only approximately two percent. In addition, the total resistance of the conventional spin valve 1 is low. Thus, the read signal output by the conventional spin valve 1 is very low. Although spin transfer can be used to write to a conventional spin valve 1, the output signal when reading from the conventional spin valve 1 is low enough to make it difficult to use the conventional spin valve 1 in a magnetic memory that is written using spin transfer.

On the other hand, a conventional spin tunneling junction 1' typically has a large resistance-area product, with Ra~kΩμm$^2$. A high current density is required to induce the spin-transfer effect could destroy thin insulating barrier due to ohmic dissipation. Moreover, the spin transfer has not been observed in the conventional spin tunneling junction 1' at room temperature. The conventional spin tunneling junction 1' having high Ra values may, therefore, not be able to be used in MRAM using spin transfer to write to the magnetic memory cells. Consequently, one of ordinary skill in the art would recognize that a reliable, localized mechanism for writing to magnetic memories having higher densities and smaller magnetic elements is still desired.

The present invention provides a method and system for providing a magnetic element capable of being written using spin-transfer effect while being thermally stable and a magnetic memory using the magnetic element. The magnetic element comprises a first, second and third pinned layers, first and second nonmagnetic layers, a free layer and a nonmagnetic spacer layers. The first, second and third pinned layers are ferromagnetic and have first, second and third magnetizations pinned in first, second and third directions. The first and second nonmagnetic layers include first and second diffusion barriers, respectively. The first and second nonmagnetic layers are between the first and second pinned layers and the second and third pinned layers, respectively. The first and second pinned layers and the second and third pinned layers are antiferromagnetically coupled. The nonmagnetic spacer layer is conductive and resides between the free layer and the third pinned layer. In addition, performance can be further improved by doping Co containing ferromagnetic layers with Cr and/or Pt.

The present invention will be described in terms of a particular magnetic memory and a particular magnetic element having certain components. However, one of ordinary skill in the art will readily recognize that this method and system will operate effectively for other magnetic memory elements having different and/or additional components and other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. For example, the present invention is described in terms of a bottom spin valve (having a pinned layer at the bottom of the spin valve) combined with a top spin tunneling junction (having a pinned layer at the top of the spin tunneling junction). The present invention is also consistent with a top spin valve and a bottom spin tunneling junction. In addition, the method and system are described in the context of certain layers being synthetic. However, one of ordinary skill in the art will readily recognize that other and/or additional layers could be synthetic.

The present application is related U.S. patent application Ser. No. 10/213,537 entitled MAGNETIC ELEMENT UTILIZING SPIN TRANSFER AND AN MRAM DEVICE USING THE MAGNETIC ELEMENT," filed on Aug. 6, 2002 and assigned to the assignee of the present application. Applicant hereby incorporates by reference the above-mentioned co-pending application. The above-mentioned co-pending application describes magnetic elements that utilizes spin transfer as a mechanism for switching the magnetization of the magnetic element.

Figure 3:
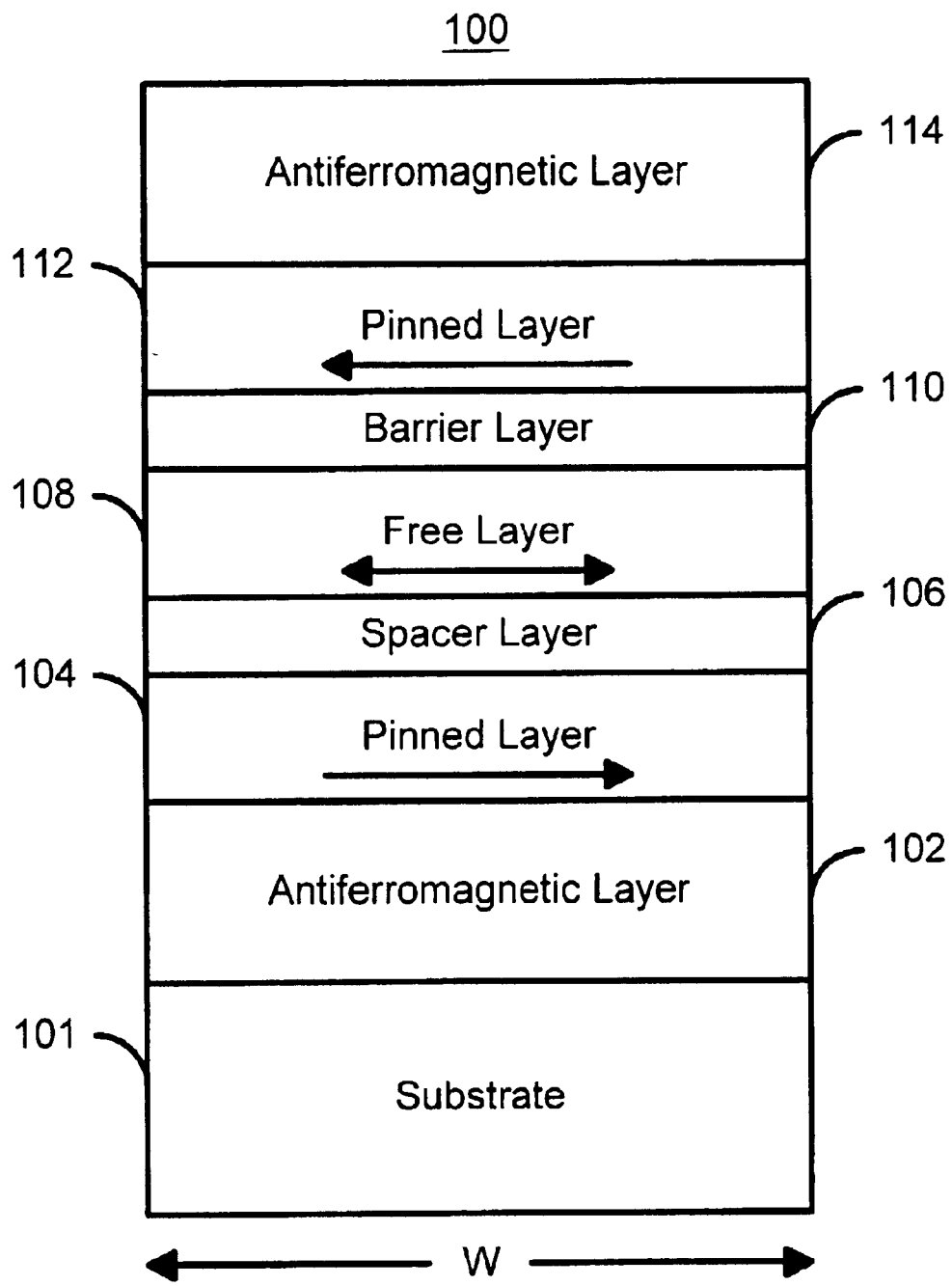
FIG. 3 is a diagram depicting one embodiment of a magnetic element described in the cross-referenced co-pending application.

FIG. 3 depicts one embodiment of a magnetic element 100 described in the above-identified co-pending patent application. Note that other layers, such as seed or capping layers, are not depicted for clarity. The magnetic element 100 is formed on a substrate 101. The magnetic element 100 includes a first antiferromagnetic layer 102, a first pinned layer 104, a conductive spacer layer 106, a free layer 108, an insulating barrier layer 110, a second pinned layer 112 and a second antiferromagnetic layer 114. Note that the first pinned layer 104, the free layer 108 and the second pinned layer 112 are depicted as single constituent ferromagnetic layers. The magnetic element 100 can be considered to be a combination of a spin valve and a spin tunneling junction. The spin valve would be considered to include the first antiferromagnetic layer 102, the first pinned layer 104, the conductive spacer layer 106, and the free layer 108. The spin tunneling junction would be considered to include the free layer 108, the insulating barrier layer 110, the second pinned layer 112 and the second antiferromagnetic layer 114. In the preferred embodiment, the spin valve portion of the magnetic element 100 writes to the free layer 108 using spin transfer, while the spin tunneling portion of the magnetic element 100 is used to read the magnetic element 100.

The magnetic element 100 is configured to allow the magnetization of the free layer 108 to be switched using spin transfer. Consequently, the dimensions of the magnetic element 100 are small, in the range of few hundred nanometers. In a preferred embodiment, the dimensions of the magnetic element 100 are less than two hundred nanometers and preferably approximately one hundred nanometers. The magnetic element 100 preferably has a depth, perpendicular to the plane of the page in FIG. 3, of approximately fifty nanometers. The depth is preferably smaller than the width of the magnetic element 100 so that the magnetic element 100 has some shape anisotropy, ensuring that the free layer 108 has a preferred direction. In addition, the thickness of the free layer 108 is low enough so that the spin transfer is strong enough to rotate the free layer magnetization into alignment with the magnetizations of the pinned layers 104 and 112. In a preferred embodiment, the free layer 108 has a thickness of less than or equal to 10 nm.

The pinned layers 104 and 112 and free layer 108 are ferromagnetic. Moreover, as discussed above, the magnetic element 100 preferably has some anisotropy so that the free layer 108 has a preferred direction. The conductive spacer layer 106 is preferably Cu or other nonmagnetic transition metal. The barrier layer 110 is thin enough to allow the tunneling of electrons through the barrier layer 110 and is preferably composed of alumina.

The magnetizations of the first pinned layer 104 and the second pinned layer 112 are depicted as being pinned in opposite directions. In an alternate embodiment, the magnetizations of the pinned layers 104 and 112 may be pinned in the same direction. For example, if a synthetic free layer is used, the pinned layers 104 and 112 are preferably pinned in the same direction. Thus, in a preferred embodiment, the pinned layers 104 and 112 adjacent to the spacer layer 106 and the barrier layer 110, respectively, are desired to be aligned in opposite directions. This orientation is desired so that if the spin tunneling junction portion of the magnetic element 100 can be made to contribute to spin transfer, as described below, then the magnetic element can be written as desired by using a smaller current density.

The antiferromagnetic layers 102 and 114 are used to pin the magnetizations of the pinned layers 104 and 112, respectively. The antiferromagnetic layers 102 and 114 are preferably composed of PtMn. However, nothing prevents the antiferromagnetic layers 102 and 114 from including other antiferromagnetic materials, such as NiMn, PdMn and IrMn.

Antiferromagnetic layers 102 and 114 having different blocking temperatures are preferably used when the pinned layers 104 and 112 are to be pinned in different directions.

In operation, the magnetic element 100 is written by using spin transfer. Currently, the spin transfer phenomenon is predominantly provided using the spin valve portion of the magnetic element 100. In particular, a current can be driven from the second pinned layer 112 through the free layer 108 and the first pinned layer 104. Such a current corresponds to electrons spin polarized in the direction of magnetization of the first pinned layer 104 and can thus set the magnetization of the free layer 108 in the same direction as the first pinned layer 104. Similarly, when is current driven in the opposite direction, minority electrons reflecting off of the first pinned layer 104 and returning to the free layer 108 can switch the magnetization of the free layer 108 to be opposite to the magnetization of the pinned layer 104.

Consequently, spin transfer can be used to write to magnetic element 100. As a result, a switching field driven by an external current is unnecessary. Instead, a more localized and reliable phenomenon is used to write to the magnetic element 100. In addition, for a magnetic element 100 having the preferred dimensions, a sufficient current density on the order of $10^7$ Amps/cm$^2$ can be provided at a relatively small current. As a result, the use special circuitry for delivering very high currents may be avoided.

Additional advances in spin tunneling junctions with low Ra of few $\Omega\mu m^2$ may allow the spin tunneling junction portion (108, 110, 112 and 114) of the magnetic element 100 to contribute to the spin transfer. Consequently, in a preferred embodiment, the magnetizations of the pinned layers 104 and 112 are in opposite directions so that the spin tunneling junction portion of the magnetic element 100 has an opportunity to appropriately contribute to the spin transfer. In such an embodiment, the current required to switch the direction of magnetization of the free layer 108 may be further reduced, for example by a factor of two.

During reading, the properties of the spin tunneling junction portion of the magnetic element 100 are preferably exploited. Because of the existence of the insulating barrier 110 and the second pinned layer 112, the spin tunneling portion of the magnetic element 100 dominates the output signal. Although writing to the magnetic element 100 sets the magnetization of the free layer 108 with respect to the first pinned layer 104, the magnetization of the free layer 108 with respect to the second pinned layer 110 dominates the output signal of the magnetic element, both in total resistance and in magnetoresistance changes. Because the magnetoresistance due to the spin tunneling junction portion of the magnetic element 100 is much larger than (preferably at least twenty times) that from spin-valve portion in the CPP configuration, the magnetic element 100 provides a sufficient signal at lower current densities in the CPP configuration.

Thus, the magnetic element 100 can be written by exploiting the spin-transfer phenomenon. Because spin transfer is used, an external current producing an external switching magnetic field is no longer needed to write to the free layer 108 of the magnetic element 100. Instead, a current driven through the magnetic element 100 is used. As a result, there is less cross talk and less power consumed. In addition, spin transfer has been found to be a more reliable switching mechanism than an external switching field. Furthermore, for a magnetic element having the preferred size, the current required to write to the magnetic element 100 may be reduced. The magnetic element 100 also has a significantly higher output signal when being read in a CPP configuration than a conventional spin valve because of the presence of the spin tunneling junction portions (layers 108, 110, 112 and 114) of the magnetic element 100. Consequently, the magnetic element 100 is suitable for use as a storage element in a higher density magnetic memory such as MRAM.

Figure 4:
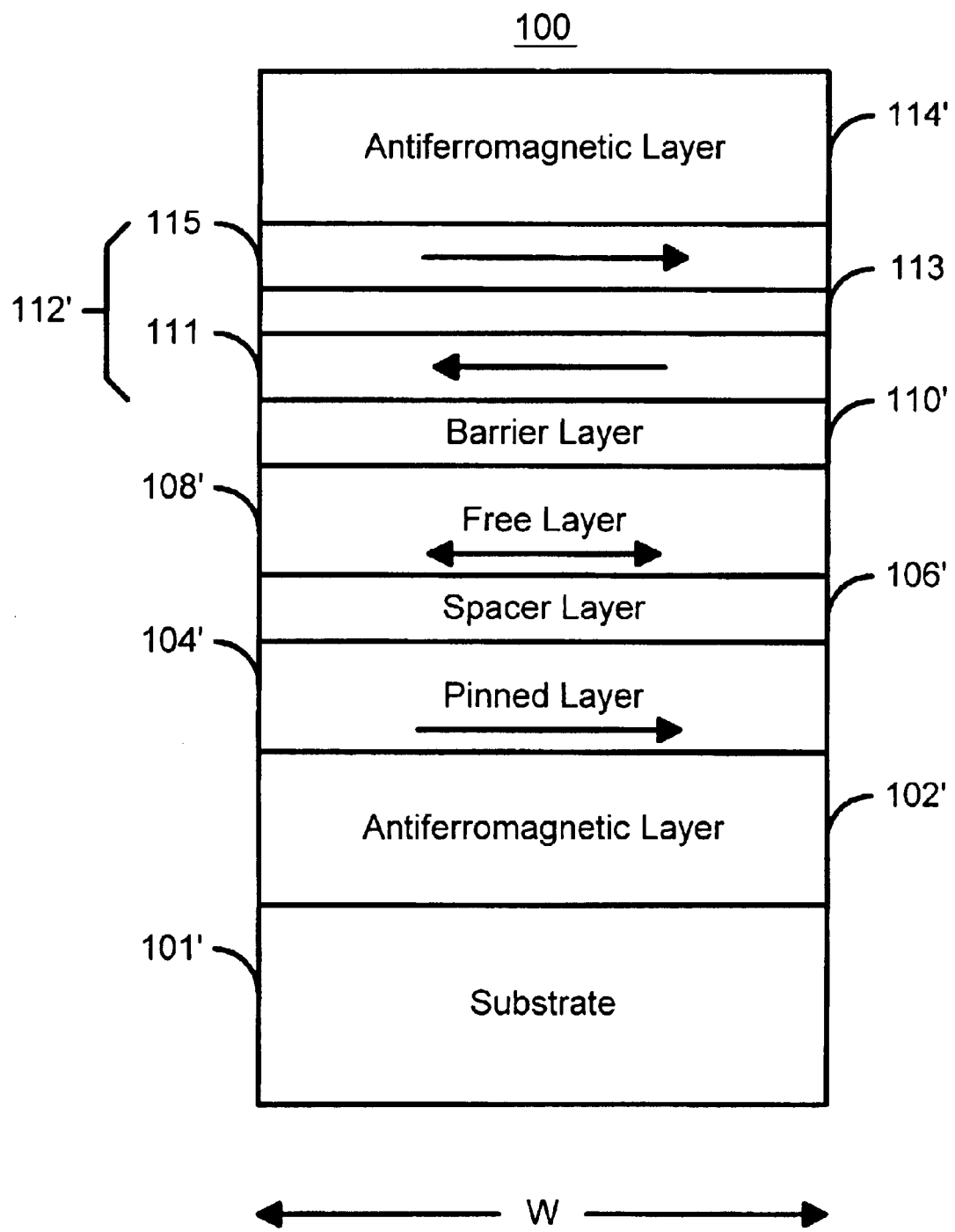
FIG. 4 is a diagram depicting another embodiment of a magnetic element in the cross-referenced co-pending application.

FIG. 4 is a diagram depicting another embodiment of a magnetic element 100' described in the above-identified co-pending application. The magnetic element 100' has many of the same components as the magnetic element 100 depicted in FIG. 3. Consequently, analogous structures are labeled similarly for the magnetic element 100' depicted in FIG. 4. In addition, these components are preferably fabricated in an analogous manner and made from similar materials as analogous components in the magnetic element 100. However, the second pinned layer 112' of the magnetic element 100' is a synthetic pinned layer 112'. Thus, the synthetic pinned layer 112' includes ferromagnetic layers 111 and 115 separated by a nonmagnetic conductive spacer layer 113. The nonmagnetic spacer layer 113 preferably includes materials such as Ru, Ir and Re. The thickness of the nonmagnetic spacer layer is such that the ferromagnetic layers 111 and 115 are antiferromagnetically coupled.

The synthetic pinned layer 112' simplifies the annealing process which sets the pinning directions of the magnetizations of the second pinned layer 112' and the first pinned layer 104'. In particular, use of the synthetic pinned layer 112' allows the antiferromagnetic layers 102' and 114' to be made from the same material, preferably PtMn, aligned in the same direction and in the same step. As a result, the desired directions of the magnetizations of the ferromagnetic layers 104' and 111 adjacent to the spacer layer 106' and barrier layer 110', respectively, are more easily established.

Thus, the magnetic element 100' can also be written by exploiting the spin-transfer phenomenon. Consequently, the magnetic element 100' enjoys many of the same advantages as the magnetic element 100. In addition, the magnetic element 100' may be simpler to fabricate because the alignment of the antiferromagnetic layers 102' and 114' may be simplified.

Although the magnetic elements 100 and 100' function well for their intended purpose, one of ordinary skill in the art will readily recognize that the magnetic elements 100 and 100' may not be as thermally stable as desired.

Figure 5:
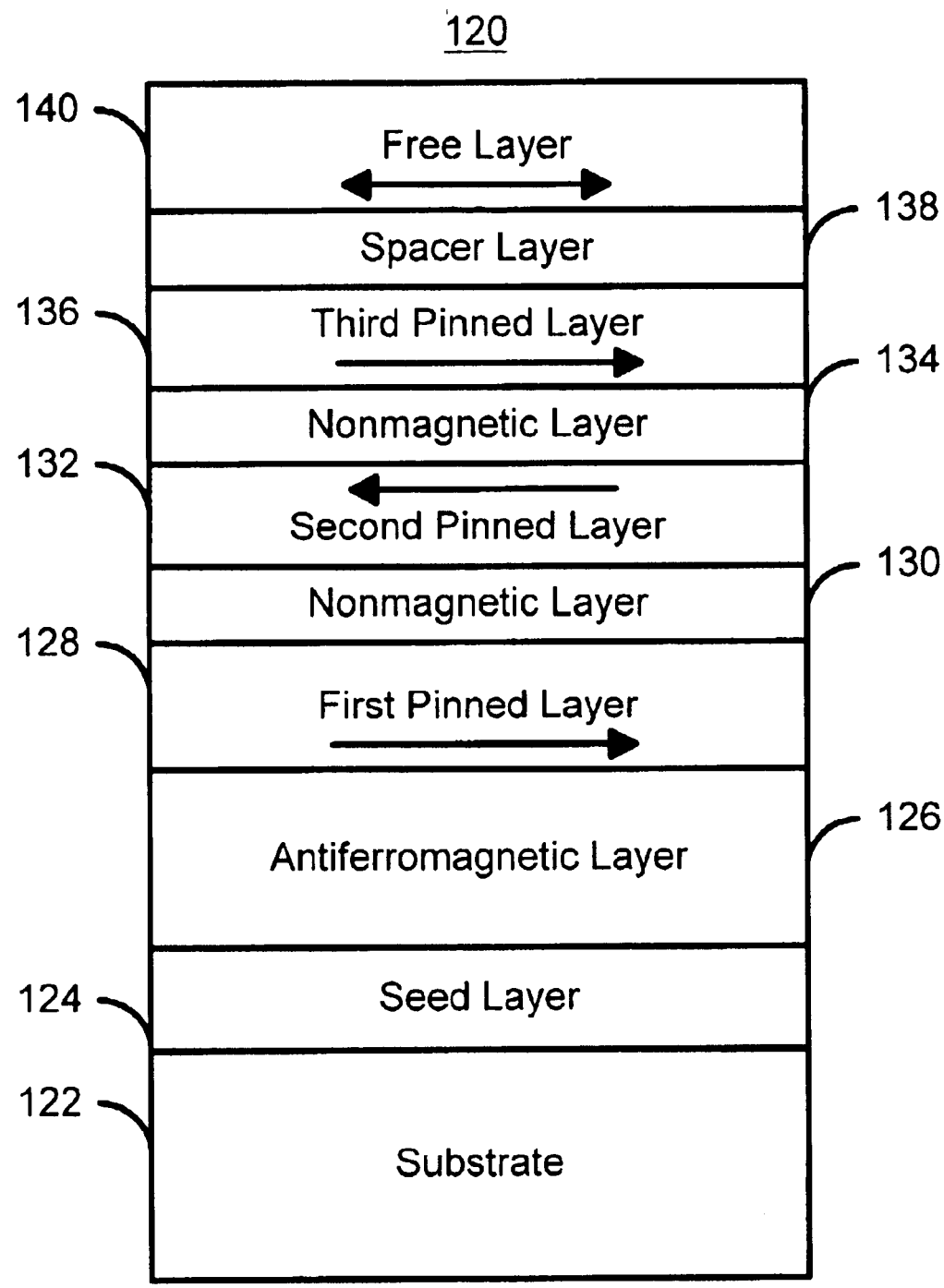
FIG. 5 is a diagram depicting one embodiment of a magnetic element in accordance with the present invention.

FIG. 5 is a diagram depicting one embodiment of a magnetic element 120 in accordance with the present invention having improved thermal stability. The magnetic element 120 is formed on a substrate 122. The magnetic element 120 includes a seed layer 124, an antiferromagnetic layer 126, pinned layers 128, 132 and 136, nonmagnetic layers 130 and 134, spacer layer 138 and a free layer 140. The seed layer 124 preferably includes Ta/NiFeCr or TaN/NiFeCr. The spacer layer 138 may be either a conductor or an insulator. However, the spacer layer 138 is preferably conductive. The pinned layers 128, 132, and 136 and the free layer 140 are preferably include Co or CoFe. The pinned layers 128, 132 and 136 are separated by nonmagnetic layers 130 and 134. In addition, the pinned layers 128 and 132 are antiferromagnetically coupled. Similarly, the pinned layers 132 and 136 are antiferromagnetically coupled. The antiferromagnetic layer 126 is preferably PtMn because of its improved exchange biasing field and blocking temperature. In addition, the thermal stability of magnetic element 120 can be improved due to the existence of a more stable PtMn FCT (face centered tetragonal) ordered structure after annealing. The nonmagnetic layers 130 and 134 not only provide an antiferromagnetic coupling function, but also a diffusion barrier. In a preferred embodiment, the nonmagnetic layers 130 and 134 include Ru. Ru is used because Ru is known to act as a diffusion barrier to Mn. Furthermore, two nonmagnetic layers 130 and 134 of Ru are provided in the magnetic element 120. Consequently, the ability of the Ru to block diffusion of Mn from the antiferromagnetic layer 126 is improved. In addition, the pinned layers 128, 132 and 136 are antiferromagnetically coupled. Thus, the pinning strength of the magnetizations of the pinned layers 128, 132 and 136 is improved. As a result, the thermal stability of the magnetic element 120 is improved. Furthermore, when the magnetic element 120 is used in the CPP configuration, the addition of one more pinned layer 128 and nonmagnetic layer 130 does not introduce current shunting and therefore does not decrease the GMR signal.

In addition, Pt and/or Cr may be added to one or more of the pinned layer 128, 132 and 136. Pt and/or Cr may also be added to the free layer 140. In a preferred embodiment, between one and five atomic percent of Pt and/or Cr are added to one or more of the magnetic layer 128, 132, 136 and 140. The addition of Pt or Cr aids in preventing interdiffusion among the layers of the magnetic element 120 at elevated temperatures. Cr is known to segregate into grain boundaries at elevated temperature and is very reactive with oxygen, forming stable CrOx. CrOx is a very effective diffusion barrier and prevents O diffusion along the grain boundaries. For example, the CrOx formed at interfaces of $Al_2O_3$ and ferromagnetic layers help to block the further diffusion of O from the barrier layer $Al_2O_3$ into the deep pinned 128, 132, and 136 and free layer 140 in the TMR structure. The Cr added to one or more of the ferromagnetic layers 128, 132, 136 and 140 can also react with the residual O within the layers and form stable CrOx, thereby preventing O interdiffusion between layers at elevated temperatures. Thus, the addition of a few atomic percent of Cr in Co or CoFe pinned and free layers 128, 132, 136 and 140 improves the thermal stability of the magnetic element 120 at elevated temperature.

It is believed that the addition of the Pt to a ferromagnetic layer 128, 132, 136 or 140 improves the strength of the bonds in the ferromagnetic layer 128, 132, 136 or 140 because of the strength of Co—Pt or Fe—Pt bonds. As a result, it is more difficult for Co or Fe to diffuse into adjacent layers and for an atom, such as 0 or Cu, to find a location in the lattice of the ferromagnetic layer 128, 132, 136 or 140 to occupy. It thus becomes more difficult for O or Cu to diffuse into the ferromagnetic layers 128, 132, 136 or 140. The addition of Pt in one or more of the ferromagnetic layers 128, 132, 136 and 140 also improve density, crystalline structure and flatness of layers thorough its surfactant role in the film growth. Pt can help to reduce or eliminate the void and pinholes during the film growth due to its strong affinity with other materials. Consequently, the thermal stability of the magnetic element 120 is improved by adding few percent of Cr and/or Pt in one or more of the ferromagnetic layers 128, 132, 136 or 140.

Moreover, if Pt is added to a free layer 140 that includes Co or CoFe, the perpendicular anisotropy of the free layer 140 may be increased. The addition of the perpendicular anisotropy of the free layer 140 may reduce or eliminate the large angle steady-state procession that generally takes place in magnetic switching. Thus, it becomes easier for the magnetization of the free layer 140 to switch direction. Consequently, the current density required for switching as well as the switching time can be decreased.

Thus, the magnetic element 120 has improved thermal stability and, in one embodiment, exhibits improved switching. However, the magnetic element 120 might be unsuitable for high-density memory applications without additional modifications. In particular, it would be desirable to exploit spin transfer as a switching mechanism.

Figure 6A:
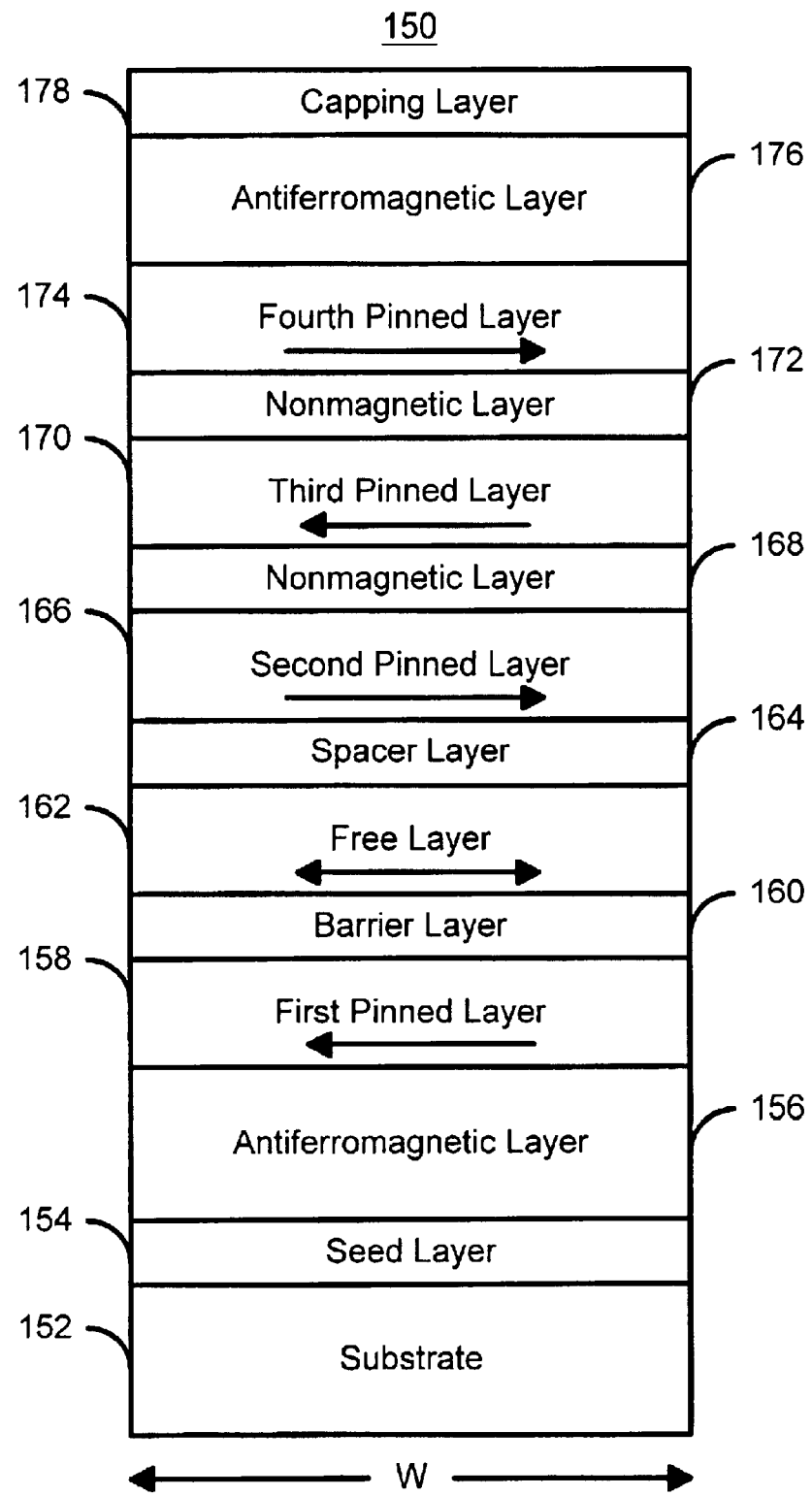
FIG. 6A is a diagram depicting another embodiment of a magnetic element in accordance with the present invention.

FIG. 6A depicts one embodiment of a magnetic element 150 in accordance with the present invention. The magnetic element 150 can be considered to be the result of replacing the spin valve portion of the magnetic element 100 with the magnetic element 120 and, in a preferred embodiment, changing the sequence of the spin valve portion and the magnetic element. The magnetic element 150 is formed on a substrate 152 and preferably includes a seed layer 154, for example composed of Ta/NiFeCr or TaN/NiFeCr. The magnetic element 100 includes a first antiferromagnetic layer 156, a first pinned layer 158, an insulating barrier layer 160, a free layer 162, a conductive spacer layer 164, a second pinned layer 166, a first nonmagnetic layer 168, a third pinned layer 170, a second nonmagnetic layer 172, a fourth pinned layer 174 and a second antiferromagnetic layer 176. Also depicted is a capping layer 178, which may include Ta or TaN. Note that the first pinned layer 158 and free layer 162 are depicted as single constituent ferromagnetic layers. However, one of ordinary skill in the art will readily recognize that any portion of the layers 158 and 162 can be synthetic. In addition, the magnetic element 150 can be considered to be a combination of a spin valve and a spin tunneling junction. The spin tunneling junction would be considered to include the free layer 162, the insulating barrier layer 160, the first pinned layer 158 and the first antiferromagnetic layer 156. The spin valve would be considered to include the second antiferromagnetic layer 176, the pinned layers 166, 170 and 174, the nonmagnetic layers 168 and 172, the conductive spacer layer 164, and the free layer 162. In the preferred embodiment, the spin valve portion of the magnetic element 150 writes to the free layer 162 using spin transfer, while the spin tunneling portion of the magnetic element 150 is used to read the magnetic element 150.

The magnetic element 150 is configured to allow the magnetization of the free layer 162 to be switched using spin transfer. Consequently, the dimensions of the magnetic element 150 are small, in the range of few hundred nanometers. In a preferred embodiment, the dimensions of the magnetic element 150 are less than two hundred nanometers and preferably approximately one hundred nanometers. The magnetic element 150 preferably has a depth, perpendicular to the plane of the page in FIG. 6A, of approximately fifty nanometers. The depth is preferably smaller than the width of the magnetic element 150 so that the magnetic element 150 has some shape anisotropy, ensuring that the free layer 162 has a preferred direction. In addition, the thickness of the free layer 162 is low enough so that the spin transfer is strong enough to rotate the free layer magnetization into alignment with the magnetization of the pinned layers 158 or 166. In a preferred embodiment, the free layer 162 has a thickness of less than 5 nm.

The pinned layers 158, 166, 170 and 174 and free layer 162 are ferromagnetic. The pinned layers 158, 166, 170 and 174 as well as the free layer 162 may include Co, Fe, Ni and their alloys. In a preferred embodiment the ferromagnetic layers 158, 162, 166, 170, and 174 include CoFe or Co, with impurities added as discussed below. Also in a preferred embodiment, the thicknesses of the ferromagnetic layer 158, 162, 166, 170, and 174 are selected to balance the interaction and demagnetization fields of the ferromagnetic layers so that the free layer 162 does not experience a strong net bias.

In other words, the total of the dipolar, static, and interlayer coupling fields preferably sum to zero to reduce the bias on the free layer 162. Moreover, the magnetic element preferably has some shape anisotropy so that the free layer 162 has a preferred direction. The conductive spacer layer 164 is preferably Cu or other nonmagnetic transition metal. The barrier layer 160 is thin enough to allow the tunneling of electrons through the barrier layer 160 and is preferably composed of alumina. In alternate embodiments, the barrier layer 160 may include other dielectric materials including, but not limited to, AlN, $Ta_2O_5$, $SiO_2$, $HfO_2$, $ZrO_2$, MgO, $MgF_2$ and $CaF_2$.

The magnetizations of the first pinned layer 158 and the second pinned layer 166 are depicted as being pinned in opposite directions. In an alternate embodiment, the magnetizations of the pinned layers 158 and 166 may be pinned in the same direction. For example, if a synthetic free layer is used, the pinned layers 158 and 166 are preferably pinned in the same direction. However, in an embodiment which may not function as well as the preferred embodiment, the pinned layers 158 and 166 may still be pinned in the same direction when a simple free layer is used. Thus, in a preferred embodiment, the pinned layers 166 and 158 adjacent to the spacer layer 164 and the barrier layer 160, respectively, are desired to be aligned in opposite directions. This orientation is desired so that if the spin tunneling junction portion of the magnetic element 150 can be made to contribute to spin transfer, as described below, then the magnetic element can be written as desired by using a smaller current density.

The antiferromagnetic layers 156 and 176 are used to pin the magnetizations of the pinned layers 158 and 174, respectively. The antiferromagnetic layers 156 and 176 are preferably composed of PtMn. However, nothing prevents the antiferromagnetic layers 156 and 176 from including other antiferromagnetic materials, such as NiMn, PdMn and IrMn. PtMn is preferred for use in the antiferromagnetic layers 156 and 176 because PtMn has a high blocking temperature and a high exchange biasing field, which improve the thermal stability of the magnetic element 100. In addition, the PtMn can be annealed to improve its thermal stability because of its more stable FCT ordered structure. Antiferromagnetic layers 156 and 176 having different blocking temperatures are preferably used when the pinned layers 158 and 174 are to be pinned in different directions. When the antiferromagnetic layer 156 has a higher blocking temperature than the antiferromagnetic layer 176, the orientation of the antiferromagnetic layer 176 can be set independently from the antiferromagnetic layer 156 by annealing the magnetic element 150 at a temperature close to the blocking temperature of the antiferromagnetic layer 176. As a result, the magnetizations of the pinned layers 156 and 176 can be pinned in different directions.

In operation, the magnetic element 150 is written by using spin transfer. Currently, the spin transfer phenomenon is predominantly provided using the spin valve portion of the magnetic element 150. In particular, a current can be driven from the first pinned layer 158 through the free layer 162 and the second pinned layer 166. Such a current corresponds to electrons spin polarized in the direction of magnetization of the second pinned layer 166 and can thus set the magnetization of the free layer 162 in the same direction as the second pinned layer 166. Similarly, when is current driven in the opposite direction, from the second pinned layer 166 through the free layer 162 and the first pinned layer 158, minority electrons reflecting off of the second pinned layer 166 and returning to the free layer 162 can switch the magnetization of the free layer 162 to be opposite to the magnetization of the pinned layer 166.

Consequently, spin transfer can be used to write to magnetic element 150. As a result, a switching field driven by an external current is unnecessary. Instead, a more localized and reliable phenomenon is used to write to the magnetic element 150. In addition, for a magnetic element 150 having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for a magnetic element having an ellipsoidal shape of 0.06×0.12 $\mu$m$^2$. As a result, the use of special circuitry for delivering very high currents may be avoided.

Additional advances in spin tunneling junctions with low Ra of few $\Omega\mu$m$^2$ may allow the spin tunneling junction portion (156, 158, 160 and 162) of the magnetic element 150 to contribute to the spin transfer because the electron spin is conserved during tunneling. Consequently, in a preferred embodiment, the magnetizations of the pinned layers 158 and 166 are in opposite directions so that the spin tunneling junction portion of the magnetic element 150 has an opportunity to appropriately contribute to the spin transfer. In such an embodiment, the spin transfer due to conduction electrons traveling from the pinned layer 158 to the free layer 162 and conduction electrons reflected off the pinned layer 166 and returning to the free layer 162 would work together to align the magnetization of the free layer 162 in the direction of magnetization of the pinned layer 158. Similarly, spin transfer due to conduction electrons traveling from the pinned layer 166 to the free layer 162 and conduction electrons reflected off the pinned layer 158 and returning to the free layer 162 would work together to align the magnetization of the free layer 162 in the direction of magnetization of the pinned layer 166. In such an embodiment, the current required to switch the direction of magnetization of the free layer 162 may be further reduced, for example by a factor of two.

During reading, the properties of the spin tunneling junction portion of the magnetic element 150 are preferably exploited. Because of the existence of the insulating barrier 160 and the first pinned layer 158, the spin tunneling portion of the magnetic element 150 dominates the output signal. In other words, although writing to the magnetic element 150 sets the magnetization of the free layer 162 with respect to the second pinned layer 166, the magnetization of the free layer 162 with respect to the first pinned layer 158 dominates the output signal of the magnetic element, both in total resistance and in magnetoresistance changes. Thus, during reading, the state of the free layer 162 with respect to the first pinned layer 158, antiparallel (high resistance) or parallel (low resistance) to the first pinned layer 158 determines the output of the magnetic element 150. Ra for the magnetic element 150 is preferably on the order of few $\Omega\mu$m$^2$. As a result, a higher current density, on the order of $10^7$ Amps/cm$^2$, can be provided without destroying the magnetic element 150. Moreover, because the magnetoresistance due to the spin tunneling junction portion of the magnetic element 150 is much larger than (preferably at least twenty times) that from spin-valve portion in the CPP configuration, the magnetic element 100 provides a sufficient signal at lower current densities in the CPP configuration.

The magnetic element 150 can thus be written to and read from using a current driven through the magnetic element 150. The read current driven through the magnetic element 150 is less than the current driven through the magnetic element 150 during writing. The read current is less than the write current in order to ensure that the direction of magnetization of the free layer 162 magnetic element 150 is not inadvertently switched to during reading. In a preferred embodiment, the read current is an order of magnitude less than the write current.

Thus, the magnetic element 150 can be written by exploiting the spin-transfer phenomenon. Because spin transfer is used, an external current producing an external switching magnetic field is no longer needed to write to the free layer 162 of the magnetic element 150. Instead, a current driven through the magnetic element 150 is used. As a result, there is less cross talk because a more localized switching mechanism is utilized, and less power consumed. In addition, spin transfer has been found to be a more reliable switching mechanism than an external switching field. Spin transfer generates a very high effective field and can thus switch a greater percentage of magnetic elements 150 in a memory device. Furthermore, for a magnetic element having the preferred size, the current required to write to the magnetic element 150 may be reduced. The magnetic element 150 also has a significantly higher output signal when being read in a CPP configuration than a conventional spin valve because of the presence of the spin tunneling junction portions of the magnetic element 150. Consequently, the magnetic element 150 is suitable for use as a storage element in a higher density magnetic memory such as MRAM.

In addition, the magnetic element 150 may be more thermally stable. The pinned layers 166, 170 and 174 are separated by nonmagnetic layers 168 and 172. The pinned layers 166 and 170 are antiferromagnetically coupled. Similarly, the pinned layers 170 and 174 are antiferromagnetically coupled. The antiferromagnetic layer 176 is preferably PtMn because of its improved thermal stability. In addition, the thermal stability of PtMn can be improved due to the existence of a more stable PtMn FCT ordered structure. The nonmagnetic layers 168 and 172 also include a diffusion barrier. In a preferred embodiment, the diffusion barrier includes Ru. Also in a preferred embodiment, the nonmagnetic layers 168 and 172 are composed solely of Ru. Ru is used because Ru is known to act as a diffusion barrier to Mn, which resides in the antiferromagnetic layer 176. Furthermore, two layers 168 and 172 of Ru are provided in the magnetic element 150. Consequently, the ability of the Ru to block diffusion of Mn from the antiferromagnetic layer 176 is improved. In addition, the pinned layers 166, 170 and 174 are antiferromagnetically coupled. Thus, the pinning strength of the magnetizations of the pinned layers 166, 170 and 174 is improved. As a result, the thermal stability of the magnetic element 150 is improved. Furthermore, when the magnetic element 150 is used in the CPP configuration, the addition of one more nonmagnetic layer 172 and pinned layer 174 does not shunt current away from the remainder of the device 150.

In addition, Pt or Cr may be added to one or more of the pinned layers 158, 166, 170, and 174. Pt or Cr may also be added to the free layer 162. In a preferred embodiment, between one and five atomic percent of Pt and/or Cr are added to one or more of the magnetic layers 158, 162, 166, 170 and 174. The addition of Pt and/or Cr aids in preventing interdiffisuion between the layers of the magnetic element 150. It is believed that the addition of Pt and/or Cr to one or more of the ferromagnetic layers 158, 162, 166, 170 and 174 function as discussed above. As stated previously, Cr is known to segregate to grain boundaries at elevated temperatures and is very reactive with oxygen, forming stable CrOx. CrOx is a very effective diffusion barrier and prevents O diffusion along the grain boundaries. The addition of Cr in ferromagnetic layers also can react with the residual O within in the layers and form stable CrOx, thereby preventing O interdiffusion between layers at elevated temperature. Thus, the addition of few atomic percent of Cr in Co or CoFe pinned and free layers improved the thermal stability of the magnetic element at elevated temperature. Similarly, as discussed above, it is believed that the addition of the Pt to a ferromagnetic layers 158, 162, 166, 170 and 174 improves the strength of the bonds in the ferromagnetic layers 158, 162, 166, 170 and 174 because of the strength of Co—Pt or Fe—Pt bonds. The addition of Pt in the ferromagnetic layers 158, 162, 166, 170 and 174 also improves the density, crystalline structure and flatness of layers through its surfactant role in the film growth. Pt can help to reduce or eliminate the void and pinholes during the film growth due to its strong affinity with other materials. Consequently, the thermal stability of the magnetic element 150 is improved by adding few percent of Cr and/or Pt in the ferromagnetic layers.

Moreover, if Pt is added to a free layer 162 that includes Co or CoFe, the perpendicular anisotropy of the free layer 162 may be increased. The addition of the perpendicular anisotropy of the free layer 162 may reduce or eliminate the large angle steady-state procession that generally takes place in magnetic switching. Thus, it becomes easier for the magnetization of the free layer 162 to switch direction. Consequently, the current density required for switching as well as the switching time can be decreased.

Thus, the magnetic element 150 has improved thermal stability and, in one embodiment, exhibits improved switching. The magnetic element 150 also reaps the benefits of spin transfer. Consequently, the magnetic element 150 is also suitable for high-density memory applications without additional modifications.

Figure 6B:
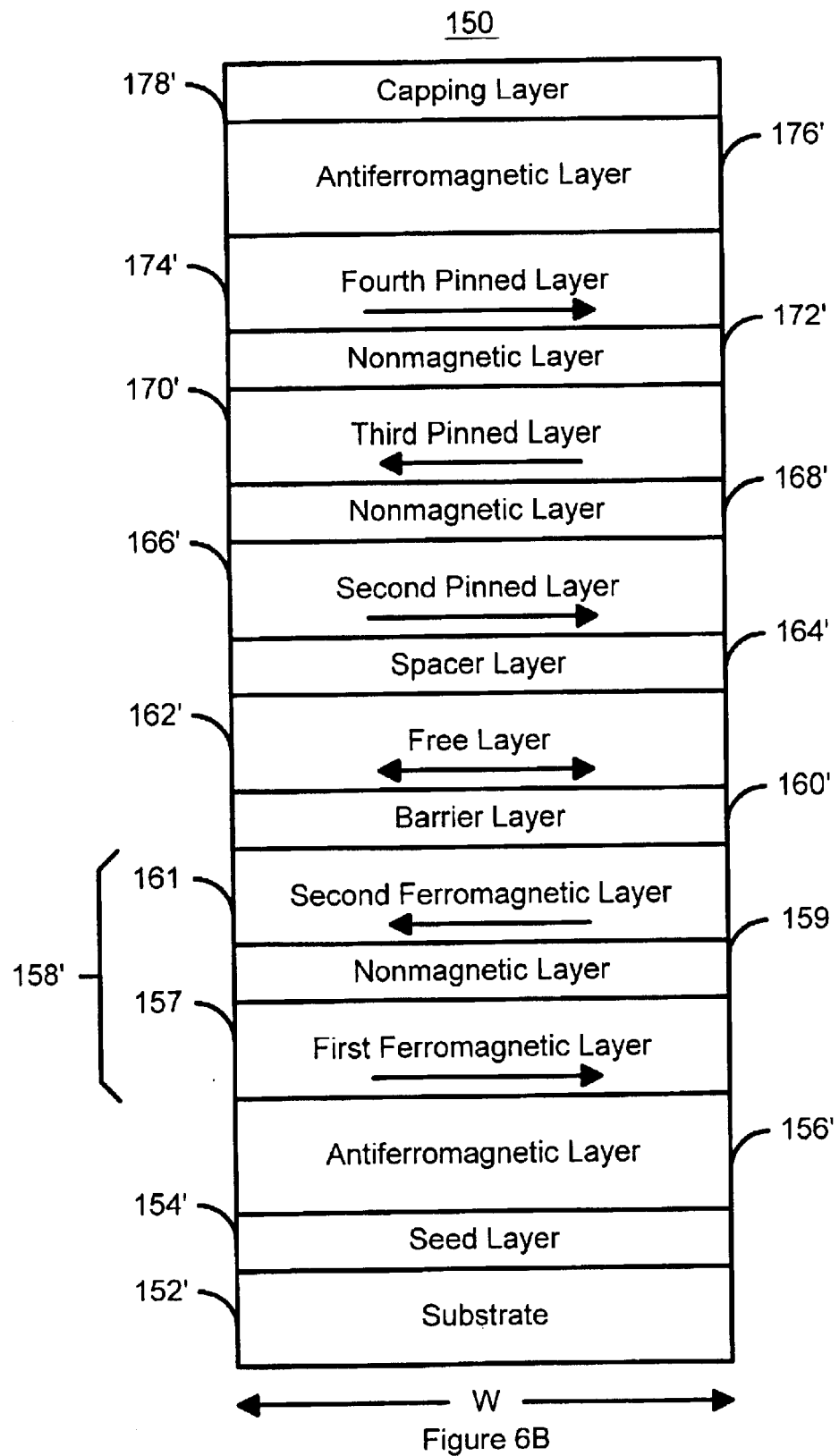
FIG. 6B is a diagram depicting another, preferred embodiment of a magnetic element in accordance with the present invention.

FIG. 6B is a diagram depicting another embodiment of a magnetic element 150' in accordance with the present invention. The magnetic element 150' has many of the same components as the magnetic element 150 depicted in FIG. 6A. Consequently, analogous structures are labeled similarly for the magnetic element 150' depicted in FIG. 6B. In addition, these components are preferably fabricated in an analogous manner and made from similar materials as analogous components in the magnetic element 150. However, the first pinned layer 158' of the magnetic element 150' is a synthetic pinned layer 158'. Thus, the synthetic pinned layer 158' includes ferromagnetic layers 157 and 161 separated by a nonmagnetic layer 159. The magnetic layers 157 and 161 preferably include Co or CoFe. The nonmagnetic layer 159 preferably includes a diffusion barrier such as Ru. The thickness of the nonmagnetic layer 159 is such that the ferromagnetic layers 157 and 161 are antiferromagnetically coupled. Thus, the pinning strength of the (synthetic) pinned layer 158' is improved through the use of antiferromagnetically coupled layers 157 and 161. In addition, the use of the nonmagnetic layer 159 having a diffusion barrier material help prevent diffusion of Mn from the antiferromagnetic layer 156' into the pinned layer 161, the insulating barrier layer 160'.

Figure 7:
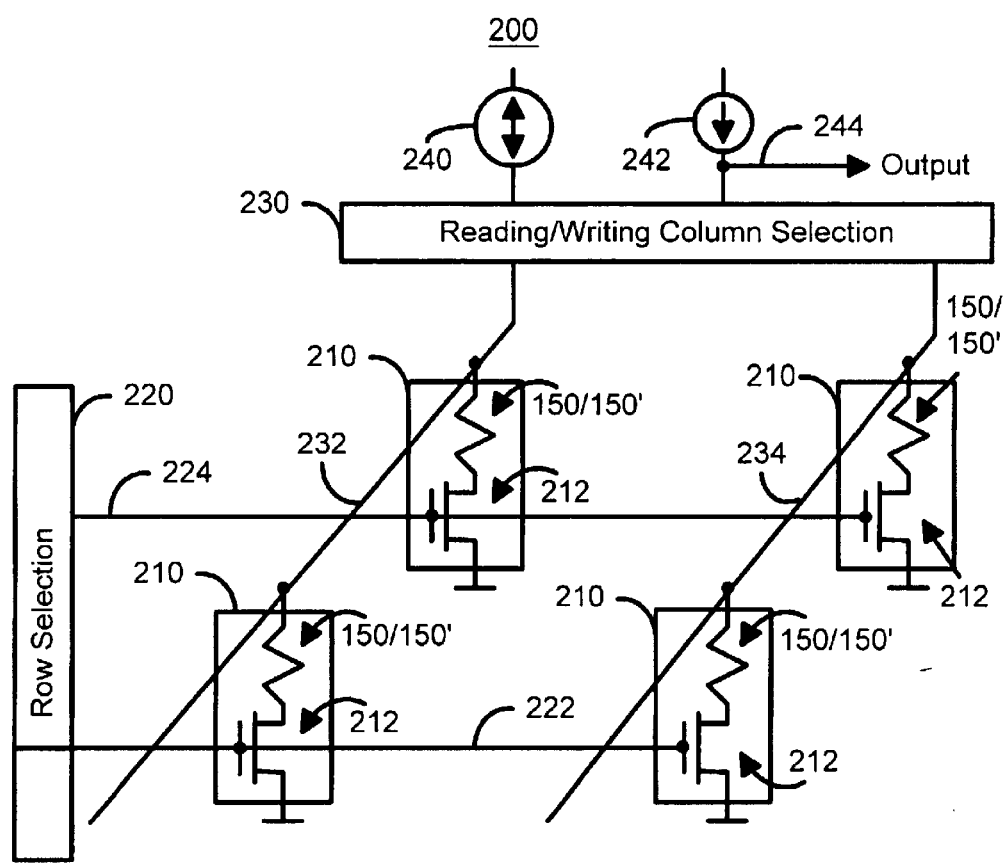
FIG. 7 is a diagram depicting one embodiment of a magnetic memory in accordance with the present invention using the magnetic element in accordance with the present invention.

FIG. 7 is a diagram depicting one embodiment of a magnetic memory array 200 in accordance with the present invention using the magnetic element 150 or 150' in accordance with the present invention. The magnetic memory array 200 is for exemplary purposes only and thus depicts a memory array 200 in which the magnetic elements 150 or 150' may be more directly incorporated into a conventional memory. Thus, each memory cell 210 includes a magnetic element 150 or 150' and a transistor 212. The magnetic memory array 200 also includes row selection mechanism 220, column selection mechanism 230, word lines 222 and 224, and bit lines 232 and 234. The magnetic memory array 200 further includes write current source 240, read current source 242 and output line 244. However, the magnetic memory array 200 does not include any write lines.

Because spin transfer is used to write to the magnetic elements 150 and 150', additional lines, such as write lines 60 and 62 of the conventional memory 10, depicted in FIG. 2, are unnecessary. Consequently, the density of the magnetic memory 200 may be further increased without high power consumption and other issues due to the use of the conventional write operation to write the conventional memory elements 1 and 1'. In addition, the circuitry used to write to the magnetic elements 150/150' can be simplified because of the omission of separate write lines.

Figure 8:
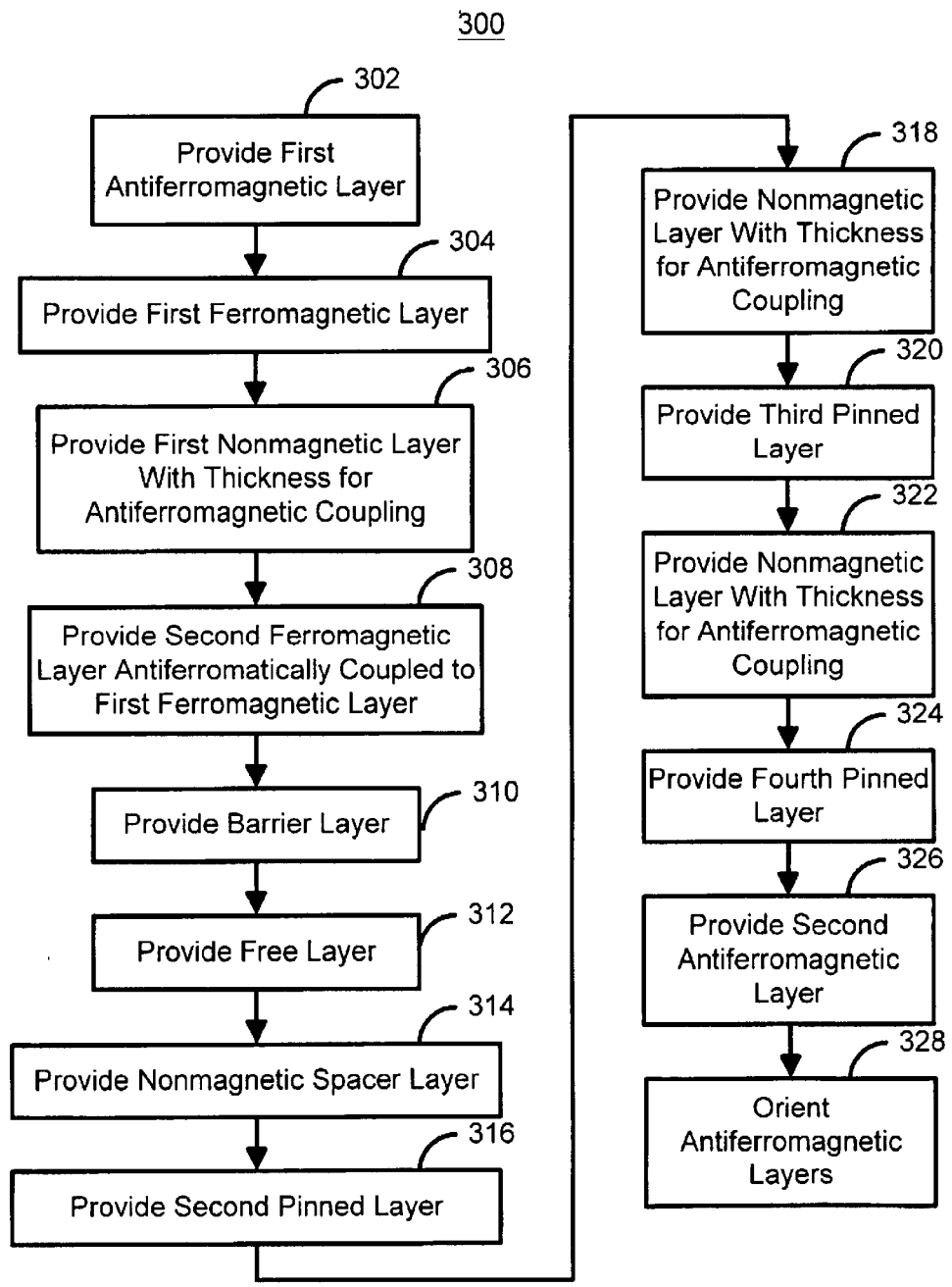
FIG. 8 is a high-level flow chart depicting one embodiment of a method in accordance with the present invention for providing a magnetic element in accordance with the present invention.

FIG. 8 is a high-level flow chart depicting one embodiment of a method 300 in accordance with the present invention for providing a magnetic element in accordance with the present invention. For clarity, the method 300 is described in the context of the magnetic element 150'. However, the method 300 could be adapted to other magnetic elements. The antiferromagnetic layer 156' is provided, via step 302. In a preferred embodiment, the antiferromagnetic layer 156' is provided on the appropriate seed layer 154'. The first ferromagnetic layer 157, the first nonmagnetic layer 159 and second ferromagnetic layer 161 are provided in steps 304, 306 and 308, respectively. In an alternate embodiment, a simple pinned layer, such as the pinned layer 158 depicted in FIG. 6A, could be provided. Referring back to FIGS. 6B and 8 the insulating barrier layer 160' is provided, via step 310. The free layer 162' and nonmagnetic spacer layer 168' are provided in steps 312 and 314, respectively. Step 312 could include providing a synthetic free layer. The second pinned layer 166', second nonmagnetic layer 168' third pinned layer 170', third nonmagnetic layer 172' and fourth pinned layer 174' are provided, via steps 316, 318, 320, 322 and 324, respectively. The second antiferromagnetic layer 176' is provided, via step 326. The orientation(s) of the antiferromagnetic layers 156' and 176' are set, via step 328. Step 328 could include independently setting the orientations of the antiferromagnetic layers 156' and 176' if the magnetization of the ferromagnetic layer 161 for the pinned layer 158' and the magnetization of the fourth pinned layer 174' (and thus the second pinned layer 166') are to be pinned in different directions. Similarly, step 328 could set the orientations of the antiferromagnetic layers 156' and 176' together. The magnetic element 150' may then be defined and other processing completed. Thus, using the method 300, the magnetic elements 150 and/or 150' may be fabricated.

A method and system has been disclosed for providing a magnetic element that can be written using spin transfer, and thus a smaller and localized switching current, which provides an adequate read signal, and which is more thermally stable. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
    a first pinned layer, the first pinned layer being ferromagnetic and having a first magnetization pinned in a first direction
    a first nonmagnetic layer, the first nonmagnetic layer being conductive and including a first diffusion barrier;
    a second pinned layer, the second pinned layer being ferromagnetic and having a second magnetization pinned in a second direction, the first nonmagnetic layer being between the first pinned layer and the second pinned layer, the second pinned layer being antiferromagnetically coupled with the first pinned layer;
    a second nonmagnetic layer, the second nonmagnetic layer being conductive and including a second diffusion barrier;
    a third pinned layer, the third pinned layer being ferromagnetic and having a third magnetization pinned in a third direction, the second nonmagnetic layer being between the third pinned layer and the second pinned layer, the third pinned layer being antiferromagnetically coupled with the second pinned layer;
    a free layer, the free layer being ferromagnetic and having a free layer magnetization; and
    a nonmagnetic spacer layer, the nonmagnetic spacer layer being conductive, the nonmagnetic spacer layer being between the free layer and the third pinned layer.

2. The magnetic element of claim 1 wherein the first diffusion barrier and the second diffusion barrier include Ru.

3. The magnetic element of claim 1 further comprising:
    a fourth pinned layer, the fourth pinned layer being ferromagnetic and having a fourth magnetization, the fourth magnetization being pinned in a fourth direction;
    a barrier layer, the barrier layer being an insulator and having a thickness that allows tunneling through the barrier layer, the barrier layer being between the free layer and the fourth pinned layer;
    wherein the magnetic element is configured to allow the free layer magnetization to change direction due to spin transfer when a write current is passed through the magnetic element.

4. The magnetic element of claim 3 wherein the fourth pinned layer includes:
    a first ferromagnetic layer having a fifth magnetization, the fifth magnetization being pinned in a fifth direction, the first ferromagnetic layer being adjacent to the barrier layer;
    a third nonmagnetic layer, the third nonmagnetic layer being conductive and including a third diffusion barrier;
    a second ferromagnetic layer, the second ferromagnetic layer being ferromagnetic and having a sixth magnetization, the sixth magnetization being pinned in a sixth direction, the second ferromagnetic layer being antiferromagnetically coupled with the first ferromagnetic layer, the fourth magnetization being the net magnetization of the first ferromagnetic layer and the second ferromagnetic layer.

5. The magnetic element of claim 4 wherein the fifth direction of the fifth magnetization of the first ferromagnetic layer is opposite to the third direction of the third magnetization of the third pinned layer.

6. The magnetic element of claim 4 further comprising:
    an antiferromagnetic layer adjacent to the second ferromagnetic layer, the antiferromagnetic layer including PtMn.

7. The magnetic element of claim 1 further comprising:
    an antiferromagnetic layer adjacent to the first pinned layer, the antiferromagnetic layer including PtMn.

8. The magnetic element of claim 3 wherein the first pinned layer, the second pinned layer, the third pinned layer, and the fourth pinned layer and the free layer include an amount of Pt or Cr.

9. The magnetic element of claim 8 wherein the amount of Pt or Cr is between one and five atomic percent.

10. The magnetic element of claim 3 wherein the magnetic element has a width of approximately 100 nm.

11. The magnetic element of claim 3 wherein the magnetic element has a depth of approximately 50 nm.

12. The magnetic element of claim 1 wherein the free layer is a synthetic free layer.

13. A magnetic memory device comprising:
   a plurality of magnetic cells including a plurality of magnetic elements, each of the plurality of magnetic elements including a first pinned layer, a first nonmagnetic layer, a second pinned layer, a second nonmagnetic layer, a third pinned layer, a nonmagnetic spacer layer and a free layer, the first pinned layer being ferromagnetic and having a first magnetization pinned in a first direction, the first nonmagnetic layer being conductive and including a first diffusion barrier, the second pinned layer being ferromagnetic and having a second magnetization pinned in a second third direction, the first nonmagnetic layer being between the first pinned layer and the second pinned layer, the second pinned layer being antiferromagnetically coupled with the first pinned layer, the second nonmagnetic layer being conductive and including a second diffusion barrier, the third pinned layer being ferromagnetic and having a third magnetization pinned in a third direction, the second nonmagnetic layer being between the third pinned layer and the second pinned layer, the third pinned layer being antiferromagnetically coupled with the second pinned layer, the free layer being ferromagnetic and having a free layer magnetization, the nonmagnetic spacer layer being conductive, the nonmagnetic spacer layer being between the free layer and the third pinned layer;
   a plurality of row lines coupled to the plurality of magnetic cells; and
   a plurality of column lines coupled with the plurality of cells, the plurality of row lines and the plurality of column lines for selecting a portion of the plurality of magnetic cells for reading and writing.

14. The magnetic memory device of claim 13 wherein the first diffusion barrier and the second diffusion barrier include Ru.

15. The magnetic memory device of claim 13 wherein each of the plurality of magnetic elements further includes:
   a fourth pinned layer, the fourth pinned layer being ferromagnetic and having a fourth magnetization, the fourth magnetization being pinned in a fourth direction;
   a barrier layer, the barrier layer being an insulator and having a thickness that allows tunneling through the barrier layer, the barrier layer being between the free layer and the fourth pinned layer;
   wherein the magnetic element is configured to allow the free layer magnetization to change direction due to spin transfer when a write current is passed through the magnetic element.

16. The magnetic memory device of claim 15 wherein the fourth pinned layer includes:
   a first ferromagnetic layer having a fifth magnetization, the fifth magnetization being pinned in a fifth direction, the first ferromagnetic layer being adjacent to the barrier layer;
   a third nonmagnetic layer, the third nonmagnetic layer being conductive and including a third diffusion barrier;
   a second ferromagnetic layer, the second ferromagnetic layer being ferromagnetic and having a sixth magnetization, the sixth magnetization being pinned in a sixth direction, the second ferromagnetic layer being antiferromagnetically coupled with the first ferromagnetic layer, the fourth magnetization being the net magnetization of the first ferromagnetic layer and the second ferromagnetic layer.

17. The magnetic memory device of claim 16 wherein the third direction of the third magnetization of the third pinned layer is opposite to the fifth direction of the first ferromagnetic layer.

18. The magnetic memory device of claim 16 wherein each of the plurality of magnetic element further includes:
   an antiferromagnetic layer adjacent to the first pinned layer, the antiferromagnetic layer including PtMn.

19. The magnetic memory device of claim 16 wherein each of the plurality of magnetic elements further includes:
   an antiferromagnetic layer adjacent to the second ferromagnetic layer, the antiferromagnetic layer including PtMn.

20. The magnetic memory device of claim 15 wherein the first pinned layer, the second pinned layer, the third pinned layer, the fourth pinned layer and the free layer include an amount of Pt or Cr.

21. The magnetic memory device of claim 20 wherein the amount of Pt or Cr is between one and five atomic percent.

22. The magnetic memory device of claim 15 wherein each of the plurality of magnetic elements has a width of approximately 100 nm.

23. The magnetic memory device of claim 15 wherein the magnetic element has a depth of approximately 50 nm.

24. The magnetic memory device of claim 14 wherein the free layer is a synthetic free layer.

25. A method for utilizing a magnetic memory comprising the steps of:
   (a) in a write mode, writing to a first portion of a plurality of magnetic cells by driving a write current in a CPP configuration through the a first portion of a plurality of magnetic elements, each of the plurality of magnetic elements including a first pinned layer, a first nonmagnetic layer, a second pinned layer, a second nonmagnetic layer, a third pinned layer, a nonmagnetic spacer layer and a free layer, the first pinned layer being ferromagnetic and having a first magnetization pinned in a first direction, the first nonmagnetic layer being conductive and including a first diffusion barrier, the second pinned layer being ferromagnetic and having a second magnetization pinned in a second third direction, the first nonmagnetic layer being between the first pinned layer and the second pinned layer, the second pinned layer being antiferromagnetically coupled with the first pinned layer, the second nonmagnetic layer being conductive and including a second diffusion barrier, the third pinned layer being ferromagnetic and having a third magnetization pinned in a third direction, the second nonmagnetic layer being between the third pinned layer and the second pinned layer, the third pinned layer being antiferromagnetically coupled with the second pinned layer, the free layer being ferromagnetic and having a free layer magnetization, the nonmagnetic spacer layer being conductive, the nonmagnetic spacer layer being between the free layer and the third pinned layer;

(b) in a read mode, reading a signal from a second portion of the plurality of cells.

26. The method of claim 25 wherein each of the plurality of magnetic elements further includes:
   a fourth pinned layer, the fourth pinned layer being ferromagnetic and having a fourth magnetization, the fourth magnetization being pinned in a fourth direction;
   a barrier layer, the barrier layer being an insulator and having a thickness that allows tunneling through the barrier layer, the barrier layer being between the free layer and the fourth pinned layer;
   wherein the magnetic element is configured to allow the free layer magnetization to change direction due to spin transfer when a write current is passed through the magnetic element.

27. A method for utilizing a magnetic element comprising the steps of:
   (a) in a write mode, driving a write current in a CPP configuration through the magnetic element, the magnetic element including a first pinned layer, a first nonmagnetic layer, a second pinned layer, a second nonmagnetic layer, a third pinned layer, a nonmagnetic spacer layer and a free layer, the first pinned layer being ferromagnetic and having a first magnetization pinned in a first direction, the first nonmagnetic layer being conductive and including a first diffusion barrier, the second pinned layer being ferromagnetic and having a second magnetization pinned in a second third direction, the first nonmagnetic layer being between the first pinned layer and the second pinned layer, the second pinned layer being antiferromagnetically coupled with the first pinned layer, the second nonmagnetic layer being conductive and including a second diffusion barrier, the third pinned layer being ferromagnetic and having a third magnetization pinned in a third direction, the second nonmagnetic layer being between the third pinned layer and the second pinned layer, the third pinned layer being antiferromagnetically coupled with the second pinned layer, the free layer being ferromagnetic and having a free layer magnetization, the nonmagnetic spacer layer being conductive, the nonmagnetic spacer layer being between the free layer and the third pinned layer;
   (b) in a read mode, reading a signal from the magnetic element by driving a read current through the magnetic element in the CPP configuration, the read current being less than the write current.

28. The method of claim 27 wherein each of the plurality of magnetic elements further includes:
   a fourth pinned layer, the fourth pinned layer being ferromagnetic and having a fourth magnetization, the fourth magnetization being pinned in a fourth direction;
   a barrier layer, the barrier layer being an insulator and having a thickness that allows tunneling through the barrier layer, the barrier layer being between the free layer and the fourth pinned layer;
   wherein the magnetic element is configured to allow the free layer magnetization to change direction due to spin transfer when a write current is passed through the magnetic element.

29. The method of claim 28 wherein the write current results in the spin transfer due at least to majority and/or minority spin polarized electrons traveling from the third pinned layer to the free layer.

30. The method of claim 28 wherein the write current results in the spin transfer due at least to the majority and/or minority spin polarized electrons traveling from the fourth pinned layer to the free layer.

31. The method of claim 28 wherein a portion of the signal is due to the magnetoresistance resulting from an orientation of the free layer magnetization of the free layer with respect to the fourth magnetization of the fourth pinned layer.

32. A method for providing a magnetic element comprising the steps of:
   (a) providing a first pinned layer, the first pinned layer being ferromagnetic and having a first magnetization pinned in a first direction
   (b) providing a first nonmagnetic layer, the first nonmagnetic layer being conductive and including a first diffusion barrier;
   (c) providing a second pinned layer, the second pinned layer being ferromagnetic and having a second magnetization pinned in a second third direction, the first nonmagnetic layer being between the first pinned layer and the second pinned layer, the second pinned layer being antiferromagnetically coupled with the first pinned layer;
   (d) providing a second nonmagnetic layer, the second nonmagnetic layer being conductive and including a second diffusion barrier;
   (e) providing a third pinned layer, the third pinned layer being ferromagnetic and having a third magnetization pinned in a third direction, the second nonmagnetic layer being between the third pinned layer and the second pinned layer, the third pinned layer being antiferromagnetically coupled with the second pinned layer;
   (f) providing a free layer, the free layer being ferromagnetic and having a free layer magnetization; and
   (g) providing a nonmagnetic spacer layer, the nonmagnetic spacer layer being conductive, the nonmagnetic spacer layer being between the free layer and the third pinned layer.

33. The method of claim 32 wherein the first diffusion barrier and the second diffusion barrier include Ru.

34. The method of claim 32 further comprising:
   (h) providing a fourth pinned layer, the fourth pinned layer being ferromagnetic and having a fourth magnetization, the fourth magnetization being pinned in a fourth direction; and
   (i) providing a barrier layer, the barrier layer being an insulator and having a thickness that allows tunneling through the barrier layer, the barrier layer being between the free layer and the fourth pinned layer;
   wherein the magnetic element is configured to allow the free layer magnetization to change direction due to spin transfer when a write current is passed through the magnetic element.

35. The method of claim 34 wherein the fourth pinned layer providing step (h) includes the steps of:
   (h1) providing a first ferromagnetic layer having a fifth magnetization, the fifth magnetization being pinned in a fifth direction, the first ferromagnetic layer being adjacent to the barrier layer;
   (h2) providing a third nonmagnetic layer, the third nonmagnetic layer being conductive and including a third diffusion barrier;

(h3) providing a second ferromagnetic layer, the second ferromagnetic layer being ferromagnetic and having a sixth magnetization, the sixth magnetization being pinned in a sixth direction, the second ferromagnetic layer being antiferromagnetically coupled with the first ferromagnetic layer, the fourth magnetization being the net magnetization of the first ferromagnetic layer and the second ferromagnetic layer.

36. The method of claim 35 wherein the third direction of the third magnetization of the third pinned layer is opposite to the fifth direction of the fifth magnetization of the first ferromagnetic layer.

37. The method of claim 35 further comprising the steps of:

(i) providing an antiferromagnetic layer adjacent to the first pinned layer, the antiferromagnetic layer including PtMn.

38. The method of claim 35 further comprising the step of:

(i) providing an antiferromagnetic layer adjacent to the second ferromagnetic layer, the antiferromagnetic layer including PtMn.

39. The method of claim 34 wherein the first pinned layer, the second pinned layer, the third pinned layer, the fourth pinned layer and the free layer include an amount of Pt or Cr.

40. The method of claim 39 wherein the amount of Pt or Cr is between one and five atomic percent.

41. The method of claim 34 wherein the magnetic element has a width of approximately 100 nm.

42. The method of claim 34 wherein the magnetic element has a depth of approximately 50 nm.

43. The method of claim 33 wherein the free layer is a synthetic free layer.

* * * * *